United States Patent [19]

Gochermann et al.

[11] Patent Number: 4,540,843
[45] Date of Patent: Sep. 10, 1985

[54] SOLAR CELL

[75] Inventors: Hans Gochermann, Holm; Wilfried Schmidt; Klaus-Dieter Rasch, both of Talheim; Karl-Heinz Tentscher, Heilbronn, all of Fed. Rep. of Germany

[73] Assignees: Licentia Patent-Verwaltungs-GmbH, Frankfurt am Main; Telefunken Electronic GmbH, Heilbronn, both of Fed. Rep. of Germany

[21] Appl. No.: 585,221

[22] Filed: Feb. 29, 1984

[30] Foreign Application Priority Data

Mar. 9, 1983 [DE] Fed. Rep. of Germany ....... 3308269

[51] Int. Cl.³ ........................................... H01L 31/06
[52] U.S. Cl. .................................... 136/251; 136/244; 136/255; 136/256; 136/258; 357/30
[58] Field of Search ............... 136/255, 256, 244, 251, 136/258 PC; 357/30

[56] References Cited

U.S. PATENT DOCUMENTS

| 2,989,575 | 6/1961 | Wallace, Jr. | 136/246 |
|---|---|---|---|
| 3,811,954 | 5/1974 | Lindmayer | 136/256 |
| 4,009,054 | 2/1977 | Gochermann et al. | 136/251 |
| 4,070,206 | 1/1978 | Kressel et al. | 136/255 |
| 4,147,560 | 4/1979 | Gochermann | 136/251 |
| 4,153,476 | 5/1979 | Shelpuk | 136/246 |
| 4,163,677 | 8/1979 | Carlson et al. | 136/255 |
| 4,169,738 | 10/1979 | Luque | 136/246 |
| 4,260,428 | 4/1981 | Roy | 136/260 |
| 4,331,494 | 5/1982 | Duchateau et al. | 156/87 |
| 4,336,648 | 6/1982 | Pschunder et al. | 29/572 |
| 4,342,044 | 7/1982 | Ovshinsky et al. | 357/2 |
| 4,343,830 | 8/1982 | Sarma et al. | 427/38 |
| 4,355,196 | 10/1982 | Chai | 136/259 |
| 4,361,717 | 11/1982 | Gilmore et al. | 136/246 |
| 4,366,335 | 12/1982 | Feng et al. | 136/255 |
| 4,400,577 | 8/1983 | Spear | 136/259 |
| 4,441,113 | 4/1984 | Madan | 357/2 |

FOREIGN PATENT DOCUMENTS

| 1614832 | 12/1970 | Fed. Rep. of Germany | 136/255 |
|---|---|---|---|
| 2152895 | 4/1973 | Fed. Rep. of Germany | 136/260 |
| 2403547 | 8/1974 | Fed. Rep. of Germany | 136/256 |
| 2445642 | 4/1976 | Fed. Rep. of Germany | 136/251 |
| 2825034 | 1/1979 | Fed. Rep. of Germany | 156/87 |
| 2944185 | 5/1981 | Fed. Rep. of Germany | 29/572 |
| 3129456 | 4/1982 | Fed. Rep. of Germany | 136/251 |
| 3135353 | 7/1982 | Fed. Rep. of Germany | 357/2 |
| 52-37784 | 3/1977 | Japan | 136/256 |

OTHER PUBLICATIONS

Y. Chevalier et al., "Advances in Theory, Fabrication, & Applications of Bifacial Solar Cells", *Proceedings, 2nd E.C. Photovoltaic Solar Energy Conf.*, Berlin (West) Apr. 23–26, 1979, pp. 817–823, Reidel Pub. Co.

Harold J. Hovel, Semiconductors and Semimetals, vol. II, "Solar Cells", Academic Press, 1975, pp. 96–97; 186–189.

V. J. Rao et al., "The Role of Hydrogen in Improving Photovoltaic Response of Solar Cells on Polycrystalline Silicon", Phys. Stat. Sol.(a) 72, 745 (1982).

*Primary Examiner*—Aaron Weisstuch
*Attorney, Agent, or Firm*—Spencer & Frank

[57] ABSTRACT

The invention relates to a solar cell for exposure to light rays on both sides. The solar cell contains only one pn junction on one surface side of the semiconductor body. The base of the solar cell is uniformly and less strongly doped than the thin surface zone of the conduction type opposite to that of the semiconductor base. Both zones of the solar cell are in contact with a structured conduction path system on opposite surface sides.

23 Claims, 10 Drawing Figures

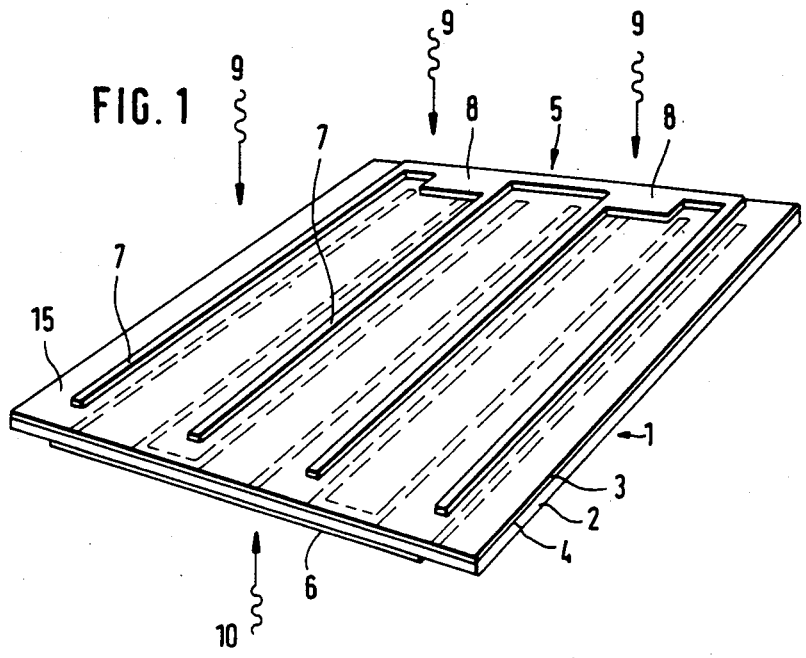
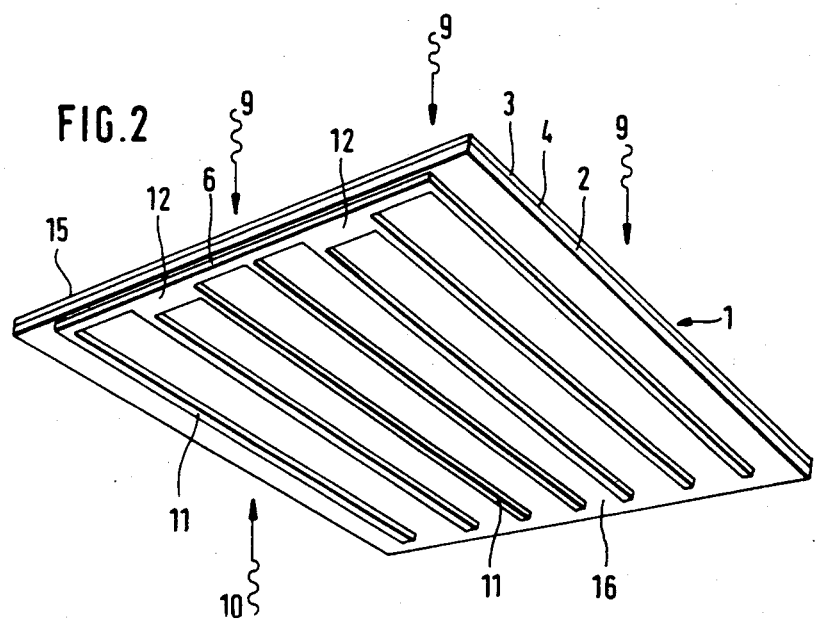

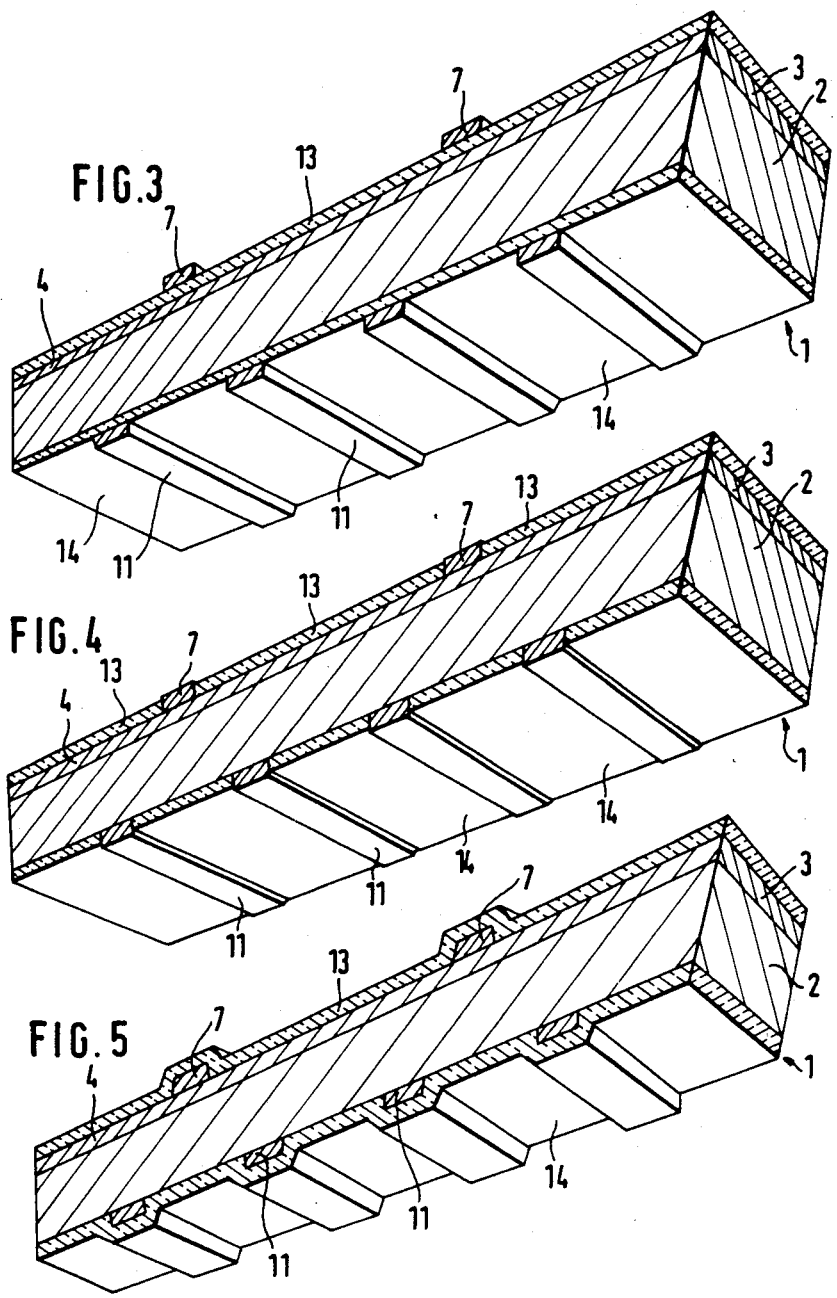

SOLAR CELL

BACKGROUND OF THE INVENTION

The invention relates to a solar cell comprised of a disc-shaped semiconductor body for exposure to rays on both sides and containing a pn-junction.

Solar cells suited for exposure to rays on both sides are, for example, known from German Offenlegungsschrift No. 1 614 832. The known solar cell comprises several pn-junctions on both surface sides of the semiconductor body. This solar cell must, therefore, be subjected to several diffusion processes, which renders it complicated and expensive to manufacture.

Also known are solar cells designed for single-sided exposure to rays which are provided with a grid- or finger-shaped conduction path system on the surface side for exposure to the incident light. The rear side of the semiconductor body is provided with a contact covering the entire surface. This solar cell for single-sided ray exposure is disadvantageous insofar as the rear side cannot be used for exposure to the incident light, and there is an increase in the operating temperature in the solar cell owing to the heat radiation to which it is subjected, which, in turn, decreases the efficiency of the solar cell. This is caused by the fact that the rear side contact of large surface area prevents the heat radiation from dissipating from the rear side of the cell again. Moreover, improvements made by a special surface treatment of the rear side of the cell are costly.

SUMMARY OF THE INVENTION

It is an object of the invention to provide a solar cell which has a greater degree of efficiency than solar cells with single-sided exposure to rays, and which, at the same time, may be manufactured at low cost and with little technological expenditure. The aim is to be able to fit this solar cell into generators of all types using known technological methods. According to the invention, there is provided a solar cell wherein the semiconductor base of the first conduction type comprises a uniform doping, wherein on one surface side of the semiconductor body there is provided a thin zone of the second conduction type which is more highly doped than the base, and wherein both zones of the solar cell are in contact on opposite surface sides of the semiconductor body with a structured conduction path system which leaves substantial areas of the semiconductor surface uncovered.

The solar cell according to the invention, therefore, comprises only one single pn-junction and, consequently, need only be subjected to one doping step. Since on both surface sides of the solar cell only small sections of the surface are provided with the structured conduction path systems, the surface area available on the front and rear sides of the solar cell for the incident light is large, resulting in a high overall degree of efficiency. It is, furthermore, possible, in the solar cell according to the invention, for the heat radiation to pass almost unhindered through the cell, so that the cell has low operating temperatures and there is no occurrence of thermomechanical problems.

In the solar cell according to the invention, the surface side of the semiconductor body on which the zone of the second conduction type is disposed is preferably utilized for incident light from the main direction of incidence which is of relatively higher intensity, while the somewhat less sensitive opposite rear side of the semiconductor body is designed for incident light from the direction of incidence with relatively lower intensity. As a result, the light falling onto the rear side of the solar cells may be made use of without incurring additional cost for the cells or generator manufacture. If the solar cell according to the invention is used in orbital solar generators, the earth's stray radiation may, therefore, be exploited. In the case of terrestrial solar generators, the solar cells may, for example, be made to face the sun, with their front side, or to follow its path in the sky. Here once again, the constantly available stray radiation may be used for exposure of the rear side of the solar cell thereto. The stray radiation occurs, for instance, in particularly high intensity if the environment is highly reflective, for example, in snow-covered surroundings, or when the generators are used over a sand surface in desert areas.

The solar cell according to the invention may consist of single or polycrystalline silicon. If, however, polycrystalline silicon is used, the solar cell must be subjected to a passivation process by means of which the effective diffusion length of the minority carriers and, consequently, the light sensitivity of the solar cell is increased. Hydrogen is particularly well suited for the purpose of passivation. The passivation process may, for example, be carried out in a hydrogen plasma.

The doping of the semiconductor base of the first conduction type is selected to be correspondingly high so that the part of the series resistance of the cell caused by correspondingly small distances between adjacent structures of the rear side conduction path system becomes small compared to the total series resistance. The semiconductor base should, furthermore, be made thin enough for a substantial part of the minority carriers produced by incident light on the rear side to reach the pn-junction. By means of these special measures it is ensured that a large part of the minority carriers produced by incident light is used for current generation. The series resistance of the solar cell is preferably further reduced by covering at least the part of the rear side of the semiconductor body located between the structures of the conduction path system with a transparent and good conducting layer. This layer may simultaneously serve as an antireflection layer. At the same time, the antireflection layer protects those parts of the surface of the semiconductor body that are covered by it, and if it should also extend over the conduction path systems, these contact structures are protected by it against outside influences.

The solar cell according to the invention may, therefore, comprise an antireflection layer on only one or on both of the surface sides of the solar cell. In the case of antireflection layers being provided on the front and rear sides of the solar cell, these are then adapted with respect to the spectral distribution of the incident light conditions to which these areas are subjected.

In order to reduce the series resistance of the solar cell it is advantageous for the distances between the structures of the conduction path system to be greater in the case of the front side contact than in the case of the rear side contact. The solar cell according to the invention is of extremely simple configuration since only one barrier layer is formed on the uniformly doped base by, for example, diffusion. The cell is, therefore, extremely cost efficient to produce and it has a very high degree of efficiency owing to the incidence of light on both sides. The design of the conduction path systems on the front and rear sides of the solar cell ensures a further increase in efficiency since the operating temperature of the cell is relatively low on account of the ease with which the heat radiation can pass through the cell. Even a decrease in operating temperature of 10° C. results in a 5% increase in cell power. The structured conduction path systems, furthermore, have the advantage over contacts of large surface area in that they have a greater resistance to fluctuations in temperature. Also, the structured conduction path systems with very fine grid or finger structures result in substantial savings in materials cost since the contact material, frequently comprised of precious metals, is very expensive.

Further advantageous embodiments of the solar cell according to the invention and its advantageous use in orbital or terrestrial solar cell generators will become apparent from the following detailed description with reference to te accompanying drawings.

BRIEF DESCRIPTION OF THE DRAWINGS

The invention and its further advantageous elaboration will now be described more particularly with reference to embodiments.

FIG. 1 shows the front side of the solar cell, and

FIG. 2 illustrates the rear side of the solar cell;

FIGS. 3 to 5 show various possibilities for the arrangement of a good conducting, transparent layer on the semiconductor surfaces of the solar cell;

DESCRIPTION OF THE PREFERRED EMBODIMENT

Figure 6:
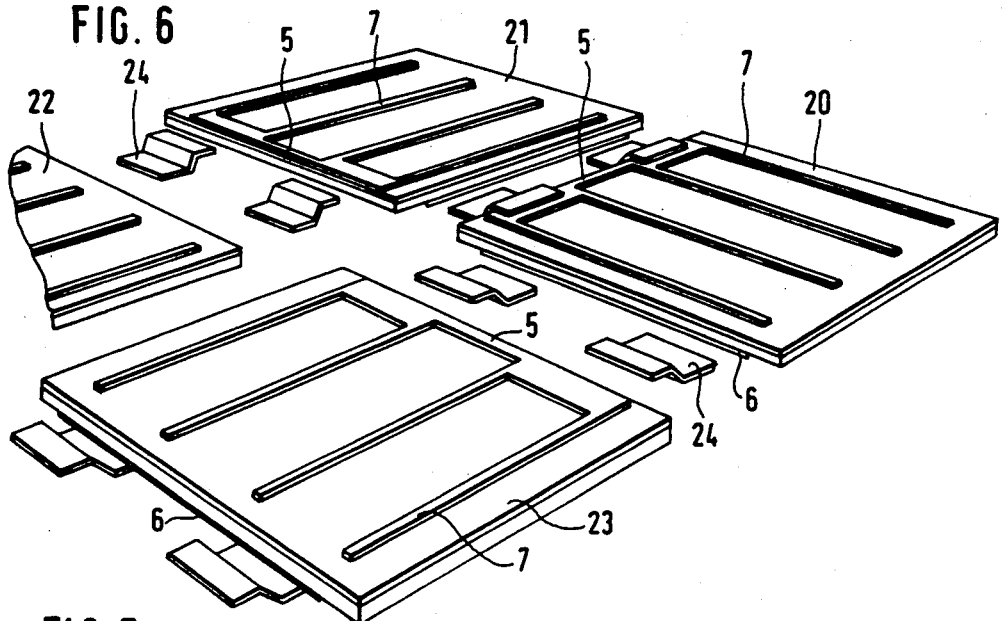
FIG. 6 shows the manner in which various solar cells may be connected to form part of a generator.

FIG. 1 shows, in perspective illustration, an embodiment of the solar cell according to the invention, with a view of its front side. The solar cell 1 consists of a thin, rectangular or round wafer or plate comprised of a suitable semiconductor material. The semiconductor material is preferably a single or polycrystalline silicon. If it is polycrystalline silicon, the semiconductor wafer must be subjected to a passivation process by which the effective diffusion length of the minority carriers is increased. Suitable for this is, for example, a glow discharge in an HF-hydrogen plasma. The passivation may be performed for one hour at a temperature of 300° C. Recombination centers of the semiconductor wafer are passivated by this procedure.

In a solar cell comprised of monocrystalline silicon, the thickness of the wafer 1 is preferably less than 0.3 mm. The uniformly doped semiconductor base 2 has a relatively low specific resistance of approximately 0.1 to 1 Ohm-cm, while the surface zone 3, disposed on this base from the front side and of the conduction type opposite to that of the base, is of very low resistance and has a sheet resistance of approximately 30 to 200 Ohms/square. This thin surface zone 3 may, for example, have a thickness of less than 0.5 μm. The pn-junction 4 may be produced by diffusion or implantation of suitable impurities. Accordingly, a $p^+n$ or $n^+p$ structure of the solar cell 1, respectively, is produced by the doping.

To establish ohmic contact with the surface zone 3, there is disposed on the front side 15 of the solar cell, provided for the incident light from the main direction of incidence 9 with the higher light intensity, a structured conduction path system 5. This conduction path system is comprised, for example, of the illustrated finger structure, with the individual fingers 7, extending parallel to one another, ending in a collector track located at the edge of the solar cell and comprising connection points 8 of widened configuration for the connector members to further solar cells.

The conduction path system 5 consists, for example, of evaporation deposited or sputtered aluminum or of a series of titanium-palladium-silver layers. The silver layer, like the aforementioned aluminum, may be produced by screen printing. A conduction path system may, furthermore, consist of electrolessly plated nickle. The individual fingers 7 of the conduction path system have, for example, a width of 200 μm and are spaced from the adjacent finger at a distance of 1 to 1.5 mm. The thickness of the conduction path system is between 2 and 10 μm.

The appearance of the cell rear side 16, which is somewhat less sensitive to the incident light than the front side 15 and is provided for the light coming from the direction of incidence 10 with less light intensity, is apparent from FIG. 2. The rear side 16 likewise comprises a conduction path system 6 again consisting, in the embodiment illustrated, of individual fingers 11 extending parallel to one another and ending in a collector track located at the edge of the cell where connection points 12 of widened configuration are provided for the connector members between adjacent solar cells. The distance between the finger structures 11 is less than that between the fingers 7 on the front side 15 of the solar cell. This, in conjunction with the doping of the semiconductor base 2, causes the fraction of the series resistance of the cell due to base and conduction path system to be small compared to the total series resistance. The distance between the finger structures 11 on the cell rear side 16, in the embodiment illustrated, is approximately 0.5 mm, while the width of the individual fingers 11 is approximately 100 μm. In this case, too, the conduction path system has a thickness of approximately 2 to 10 μm and consists of the aforementioned materials.

In the solar cell illustrated, whose thickness is preferably less than 300 μm and whose base 2 comprises a relatively high doping, it is ensured that a substantial fraction of the minority carriers produced on the rear side by incident light reaches the pn-junction 4, so that, for example, the diffused light collected by the solar cell rear side contributes substantially to the increased power efficiency of the cell.

FIG. 3 shows merely part of a solar cell 1, in perspective illustration, since only the advantageous use of a transparent, good conducting layer need be apparent from this Figure. The transparent, good conducting layers 13, 14, respectively, are located on both the rear side 16 and the front side 15, respectively, in the embodiment shown in FIG. 3. It is, however, also possible to dispense with the conductive layers 13, 14, respectively, on one or both of the surface sides. In the embodiment shown in FIG. 3, the transparent, good conducting layers, 13, 14, respectively, are located between the semiconductor base and the conduction path systems 7, 11, respectively. The layers 13, 14, each consist for example, of tin oxide which is doped with antimony or fluorine. Another suitable material is indium-tin oxide. These layers are applied to the semiconductor surfaces by, for example, sputtering or by electron beam evaporation. Another suitable process is the spray pyrolysis, known per se. On account of their good conductivity, the transparent conductive layers, 13, 14, each reduce the series resistance of the solar cell and simultaneously acts as an antireflection layer. The sheet resistance of the antireflection layer is preferably less than 60 Ohms/square and with respect to the maximum fraction of the incident light in the spectral distribution is a $\lambda/4$ layer. In terms of dimensions, this means that the layer has an approximate thickness of 70 nm. The two antireflection layers 13 and 14 on the two surface sides of the solar cell are preferably adapted to the spectral distribution of the wavelength fractions in the incident light at any given time so as to obtain a maximum degree of efficiency. This results in optimal adaptation of the solar cells to their intended use.

FIG. 4 shows another variant for the design of the antireflection layers 13, 14. In this case, the antireflection layer is only located between the finger structures 7 and 11 of the conduction path systems on the front and rear sides of the solar cells. This is achieved by the antireflection layers 13 and 14 being produced with the aid of a masking step or by the antireflection layers being first produced and the conduction path systems then being annealed in an annealing process through the antireflection layer to the semiconductor surface.

In FIG. 5, a further variant is shown, wherein the conduction path systems with the finger structures 7, 11, respectively, are first applied to the two surface sides 15 and 16 of the solar cell. Subsequently, the entire surface sides of the solar cell are covered with the antireflection layers, 13, 14, respectively, which, consequently, also extend over the conduction path systems.

Figure 7:
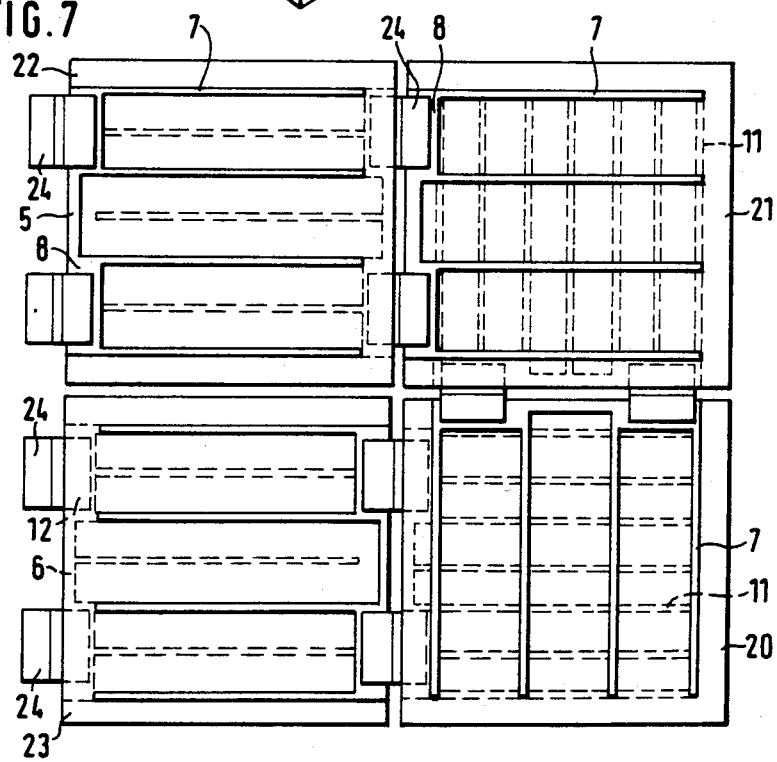
FIG. 7 shows how the conduction path systems are to be arranged on the two surface sides of the solar cells when such a connection is made.

FIG. 6 shows several solar cells 20 to 23 which are connectable to form a solar generator or part of a solar generator. To this end, the rear side contact of a solar cell must be electrically conductively connected to the front side contact of an adjacent solar cell. Accordingly, the conduction path systems on the rear side surface and on the front side surface, respectively, of the solar cell must be adapted to one another so as to enable easy interconnection of the solar cells using commonly employed technological methods. The connector members 24 required for interconnecting adjacent solar cells ought, therefore, to be of the simplest and shortest possible design. These connector members 24 may, for example, consist of silver, aluminum, tin, tin-plated copper, or silver-plated copper. Two types of cells are required for the solar generator illustrated. The solar cells arranged one behind the other in a row comprise conduction path systems wherein the finger structures 7 on the front side extend parallel to the finger structures 11 on the rear side. As is apparent from FIG. 7, this is the case, for example, with cells 22 and 23. However, since, on the other hand, solar cell rows must be linked to one another, solar cells wherein the finger structures 7 on the front side extend perpendicularly to the finger structures 11 on the rear side of the solar cell, are required for the row ends. In accordance with FIG. 7, these are the cells 20 and 21. The connection points 8, 12, respectively, for the connector members 24 to the conduction path systems 5 and 6 on the front and rear sides 15 and 16 of the solar cell are, therefore, located at opposite or adjacent side edges of the solar cell, as is apparent from FIGS. 6 and 7. The connector members 24 provide the electrical connection between a connection point 12 on the rear side of the solar cell and a connection point 8 on the front side of an adjacent solar cell, respectively.

In a further preferred embodiment, not illustrated in detail, the conduction path system comprises a finger structure on the front side of the cell, while the conduction path system on the rear side of the cell is a relatively close meshed grid-type structure.

Figure 8:
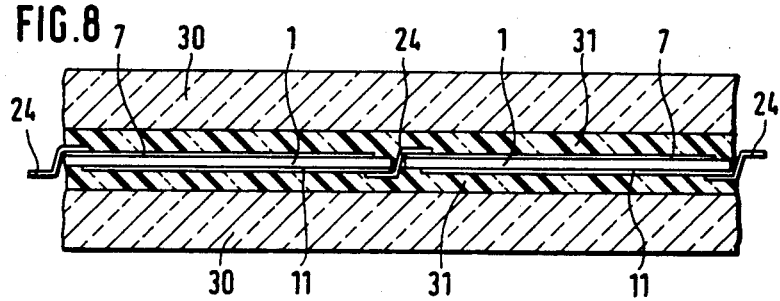
FIG. 8 shows a section of a laminated glass generator for terrestrial applications.

The solar cell according to the invention may be employed in both orbital and terrestrial solar generators. In terrestrial solar generators, the cells are generally transparently encapsulated or covered on both sides. In FIG. 8, there is shown a terrestrial laminated glass generator wherein the cells 1 are arranged in a symmetrical bond between two glass panes 30. The bond between the glass panes 30 and the cells 1 is effected by transparent elastic materials 31. The glass panes have a thickness of, for example, 2 mm, while the transparent elastic material 31 consists, for example, of two foils of PVB or EVA material with a thickness of 0.7 mm placed onto both sides of the solar cell. The bonded structure thus produced is then evacuated and heated at a temperature of 150° to 170° C. so that the transparent elastic material 31 fills out all of the cavities between the two glass panes 30.

Figure 9:
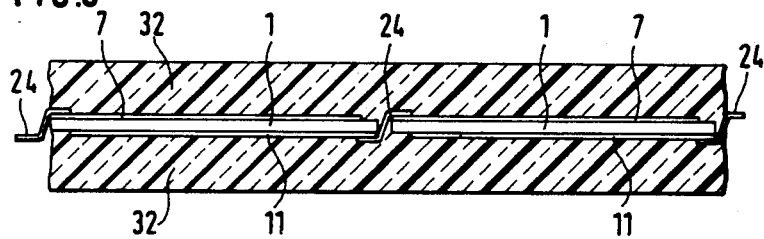
FIG. 9 shows a section of a generator wherein the carrier member consists of fiber glass reinforced resin.

FIG. 9 shows a further terrestrial solar generator wherein the embedding material 32 for the solar cells 1 consists of a transparent, glass fiber reinforced resin. To produce this generator having a thickness of 1.5 to 2 mm in the finished state, glass fiber mats are impregnated with resin and joined so as to enclose the cells 1 and subsequently cured. In this solar generator, the solar cells 1 are, therefore, located within a uniform carrier mass 32 comprised of glass fiber reinforced resin.

Figure 10:
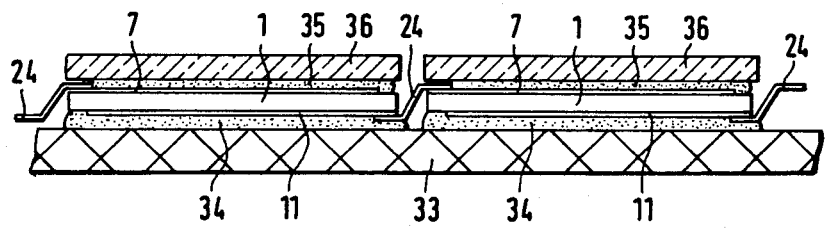
FIG. 10 shows a section of an orbital solar generator.

FIG. 10 shows a section of an orbital solar generator, wherein the solar cells 1 are attached with the aid of a transparent adhesive 34 to a carrier member 33. This carrier member 33 preferably consists of a transparent foil, a glass fiber reinforced foil or a material with a honeycomb structure. The honeycomb structure consists, for example, of honeycomb structured aluminum foils located between two transparent foils. In this orbital generator, the individual solar cells 1 are each covered on the front side with a cover glass 36 which, in turn, is preferably attached to the solar cell front side by a transparent adhesive 35. In the orbital solar generator illustrated, the carrier foil has, for example, a thickness of 100 $\mu$m. The transparent adhesive 34 has a thickness of 50 $\mu$m and the transparent adhesive 35 one of 20 $\mu$m. The cover glass members preferably have a thickness of 100 $\mu$m, while the solar cells for the orbital field of application are preferably approximately 150 $\mu$m thick.

It is evident from the embodiments described hereinabove that the solar cell according to the invention may be employed to build with the same system cost expenditure and use of proven technological methods, solar generators which exhibit substantially higher power than solar generators hitherto employed. In other words, use of the solar cells according to the invention in a generator results in a decrease in the weight per unit of power and in an improvement of the price per unit of power ratio.

What is claimed is:

1. A solar cell comprising: a plate-shaped semiconductor body, containing a pn-junction (4) and having front and rear opposite surface sides (15, 16) and a base zone (2) of a first conduction type disposed on one surface side, for exposure to rays on both sides, wherein the semiconductor base zone (2) of the first conduction type is uniformly doped; a thin zone (3) of a second conduction type with a higher doping than the base zone disposed on the other surface side of the semiconductor body; front and rear structured conduction path systems (5, 6) each including a contact having spaced apart adjacent structures, wherein said zones (2, 3) of the solar cell are each in contact with a respective one of said structured conduction path systems so as to leave substantial areas of the semiconductor surface uncovered, wherein the doping of the semiconductor base zone (2) of the first conduction type is relatively high and the spacing between the adjacent structures (11) of the rear side conduction path system (6) is relatively small whereby the resulting fraction of the series resistance of the cell is small compared to the total series resistance, and wherein the distances between the structures (7) of the conduction path system (5) in the case of the front side contact are larger than those in the case of the rear side contact (6).

2. A solar cell according to claim 1, wherein the zone of the second conduction type is disposed on the front surface side and is more sensitive to incident light than said base zone which is disposed on the rear surface side, and wherein the front surface side (15) of the semiconductor body is provided for the incident light from the main direction of incidence (9) of higher intensity, while the less sensitive, opposite rear surface side (16) of the semiconductor body (1) is provided for the incident light from the direction of incidence (10) of less intensity.

3. A solar cell according to claim 1, wherein the solar cell consists of single or polycrystalline silicon, said polycrystalline material being subjected to a passivation process to increase the effective diffusion length of the minority carriers and, consequently, increase the light sensitivity.

4. A solar cell according to claim 3, wherein hydrogen is used for the passivation.

5. A solar cell according to claim 1, wherein the semiconductor body (1) of the solar cell is thin enough for a substantial fraction of the minority carriers produced on the rear side by incident light to reach the pn-junction (4).

6. A solar cell according to claim 5, wherein the semiconductor body (1) is thinner than 0.3 mm and wherein the surface zone (3) of the second conduction type has a layer thickness of less than 0.5 μm.

7. A solar cell according to claim 1, wherein the semiconductor base zone has a specific resistance of approximately 0.1-1 Ohm cm, and the surface zone of the second conduction type has a sheet resistance of approximately 30-200 Ohms/square.

8. A solar cell according to claim 1, wherein the conduction path systems each consist of finger structures (7, 11), with the structures on the cell front side extending parallel or perpendicularly to those on the rear side.

9. A solar cell according to claim 1, wherein the conduction path system on the cell front side consists of a finger structure and on the cell rear side of a grid mesh structure.

10. A solar cell according to claim 1, wherein at least portions of the rear side (16) of the semiconductor body (1) are covered with a transparent, good conducting layer (14).

11. A solar cell according to claim 10, wherein the transparent, good conducting layer (14) covers the rear side surface (16) of the semiconductor body and wherein the conduction path system (6) of the rear side contact is arranged on this layer.

12. A solar cell according to claim 10, wherein the exposed areas of the rear side surface (16) between the structures (11) of the conduction path system disposed directly on the semiconductor surface (16) are covered with the conductive, transparent layer (14).

13. A solar cell according to claim 10, wherein the rear side surface of the solar cell provided with the structured conduction path system is totally covered with the conductive, transparent layer (14).

14. A solar cell according to claim 10 wherein the transparent, conductive layer (14) is of a thickness selected so as to reduce the series resistance of the solar cell and simultaneously act as an antireflection layer.

15. A solar cell according to claim 14, wherein the front side (15) of the solar cell is also provided with an antireflection layer (13), and wherein both antireflection layers (13, 14) on the front and rear sides of the solar cell are adapted with respect to the spectral distribution to the incident light conditions to which these surfaces are subjected.

16. A solar cell according to claim 1, wherein the structured conduction path system on the rear side surface of the solar cell is adapted to the conduction path system on the front side in a manner such that said cell is connectable with another cell of the same type to form a solar generator.

17. A solar generator comprising a plurality of adjacent solar cells each according to claim 16 and a plurality of connector members (24) which connect adjacent solar cells and, wherein the conduction path systems on the front and rear sides of each solar cell are so constructed that the connector members (24) which connect adjacent solar cells (20-23) in the generator are as short as possible.

18. A solar generator according to claim 17, wherein the connection points (8, 12) for the connector members (24) to the conduction path systems (5, 6) on the front and rear sides (15, 16) of each solar cell (1) are arranged on opposite or adjacent sides of the solar cell.

19. An orbital or terrestrial solar generator comprising a plurality of solar cells according to claim 1.

20. A solar generator comprising a plurality of solar cells each according to claim 1, in which the cells are transparently encapsulated or covered on both sides.

21. A terrestrial laminated glass solar generator comprising a plurality of solar cells each according to claim 1, wherein the cells (1) are arranged in a symmetrical bond between two glass panes (30), with the bond between the glass panes (30) and the cells (1) being effected by transparent, elastic materials (31).

22. A terrestrial solar generator comprising a plurality of solar cells each according to claim 1, wherein the cells (1) are embedded in transparent, glass fiber reinforced resin (32).

23. An orbital solar generator comprising a plurality of solar cells each according to claim 1, wherein the cells (1) are attached on their rear side to a transparent carrier member (33), comprised of a foil, a glass fiber reinforced foil, or a material with a honeycomb structure, by means of a light-permeable adhesive (34), while the front sides of the cells each comprise a cover glass (36) attached by a transparent adhesive (35).

* * * * *